United States Patent
Chan et al.

(10) Patent No.: US 9,035,386 B2
(45) Date of Patent: May 19, 2015

(54) SEMICONDUCTOR STRUCTURE AND METHOD FOR MANUFACTURING THE SAME

(71) Applicant: Macronix International Co., Ltd., Hsinchu (TW)

(72) Inventors: Ching-Lin Chan, Yunlin County (TW); Chen-Yuan Lin, Taitung (TW); Cheng-Chi Lin, Yilan County (TW); Shih-Chin Lien, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/723,272

(22) Filed: Dec. 21, 2012

(65) Prior Publication Data
US 2014/0175560 A1   Jun. 26, 2014

(51) Int. Cl.
*H01L 29/76* (2006.01)
*H01L 21/02* (2006.01)
*H01L 29/78* (2006.01)

(52) U.S. Cl.
CPC ...... *H01L 21/02697* (2013.01); *H01L 29/7816* (2013.01)

(58) Field of Classification Search
CPC ............... H01L 29/66681; H01L 29/7816; H01L 21/02697; H01L 27/088
USPC .......... 257/365, 401, 328, 335, 496, E29.256; 438/283, 284
See application file for complete search history.

(56) References Cited

U.S. PATENT DOCUMENTS

| | | | | |
|---|---|---|---|---|
| 5,541,875 | A | * | 7/1996 | Liu et al. ................. 365/177 |
| 5,973,367 | A | * | 10/1999 | Williams ................ 257/365 |
| 2003/0111707 | A1 | * | 6/2003 | Takaura et al. ............ 257/510 |
| 2007/0290232 | A1 | * | 12/2007 | Nishiyama ............... 257/202 |
| 2010/0025756 | A1 | * | 2/2010 | Fu et al. ................. 257/328 |
| 2010/0301403 | A1 | * | 12/2010 | Min et al. ............... 257/316 |
| 2011/0260247 | A1 | * | 10/2011 | Yang et al. .............. 257/343 |
| 2012/0261750 | A1 | * | 10/2012 | Yamashina et al. ......... 257/335 |
| 2013/0181285 | A1 | * | 7/2013 | Ng et al. ................ 257/335 |

* cited by examiner

*Primary Examiner* — Tu-Tu Ho
(74) *Attorney, Agent, or Firm* — McClure, Qualey & Rodack, LLP

(57) ABSTRACT

A semiconductor structure and a method for manufacturing the same are provided. The semiconductor structure comprises a first doped region, a second doped region, and a gate structure. The first doped region has a first type conductivity. The second doped region is formed in the first doped region and has a second type conductivity opposite to the first type conductivity. The gate structure is formed on the first doped region and the second doped region. The gate structure comprises a first gate portion and a second gate portion, which are separated from each other by a gap.

19 Claims, 10 Drawing Sheets

SEMICONDUCTOR STRUCTURE AND METHOD FOR MANUFACTURING THE SAME

BACKGROUND

1. Technical Field

The disclosure relates in general to a semiconductor structure and a manufacturing method thereof, and more particularly to a semiconductor structure, which can endure a relatively high gate voltage stress, and a manufacturing method thereof.

2. Description of the Related Art

A lateral diffused metal oxide semiconductor (LDMOS) device has its source and drain at the surface of the wafer causing a lateral current. Two important parameters in the design of LDMOS devices are breakdown voltage and on-state resistance. It is preferred to have a high breakdown voltage and a low on-state resistance to provide a device having relatively lower power consumption when operated under high voltage.

The HTGB (high temperature gate bias) of a conventional 700V LDMOS device is about 20V, therefore, when a gate voltage of higher than 20V is applied to the device, the breakdown may decrease dramatically, causing the device failing to function. Therefore, in order to present the above-mentioned event from happening, researchers are working on increasing the HTGB of high voltage (HV) devices.

SUMMARY

The disclosure relates to a semiconductor structure and a method for manufacturing the same. In the present disclosure, with the design of the gate structure, the semiconductor structure has a stable breakdown voltage and can endure a relatively higher gate voltage stress.

According to an aspect of the present disclosure, a semiconductor structure is provided. The semiconductor structure comprises a first doped region, a second doped region, and a gate structure. The first doped region has a first type conductivity. The second doped region is formed in the first doped region and has a second type conductivity opposite to the first type conductivity. The gate structure is formed on the first doped region and the second doped region. The gate structure comprises a first gate portion and a second gate portion, which are separated from each other by a gap.

According to another aspect of the present disclosure, a method for manufacturing a semiconductor structure is provided. The method comprises the following steps. A first doped region having a first type conductivity is formed. A second doped region having a second type conductivity opposite to the first type conductivity is formed in the first doped region. A gate structure is formed on the first doped region and the second doped region, comprising forming a first gate portion and a second gate portion separated from each other by a gap.

The disclosure will become apparent from the following detailed description of the preferred but non-limiting embodiments. The following description is made with reference to the accompanying drawings.

DETAILED DESCRIPTION

Preferred embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1A:
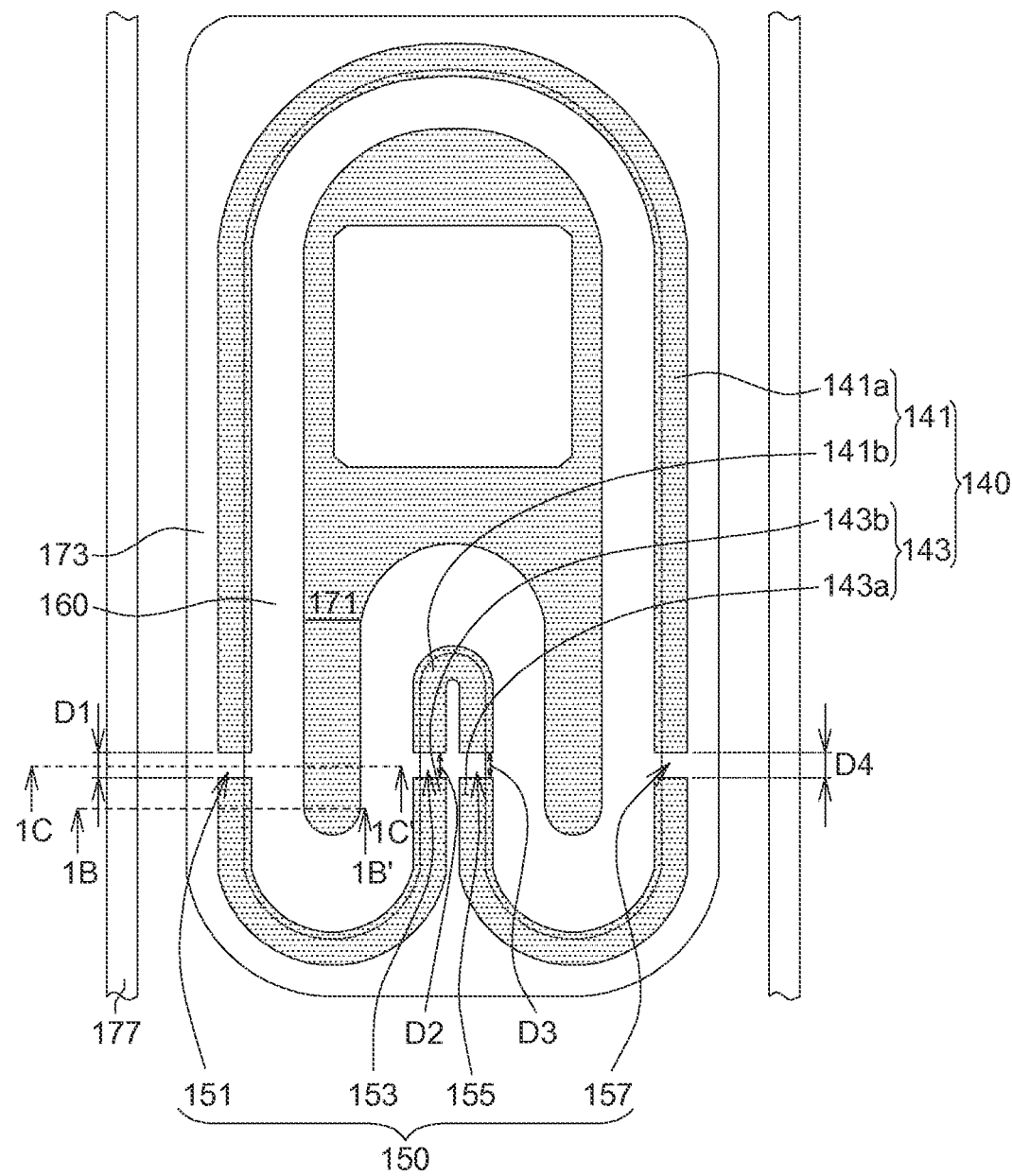
FIG. 1A shows a top view of a semiconductor according to an embodiment of the present disclosure.
Figure 1B:
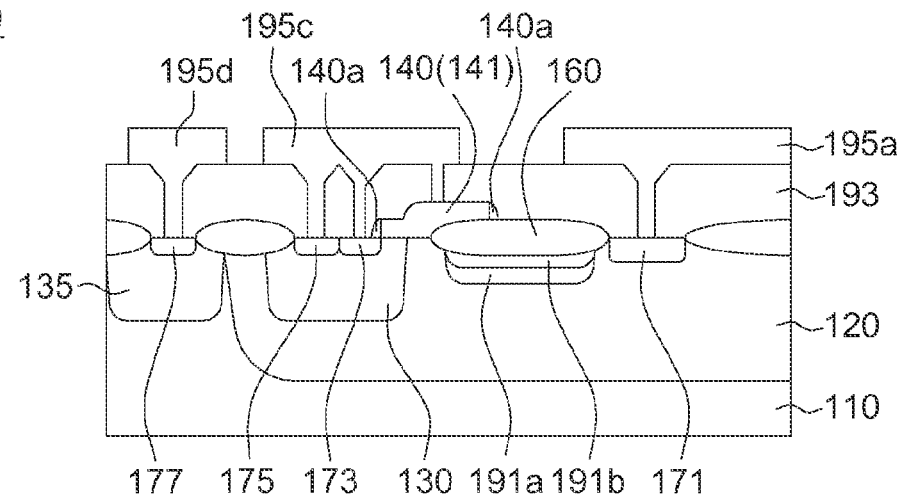
FIG. 1B shows a cross-sectional view along the section line 1B-1B' in FIG. 1A.
Figure 1C:
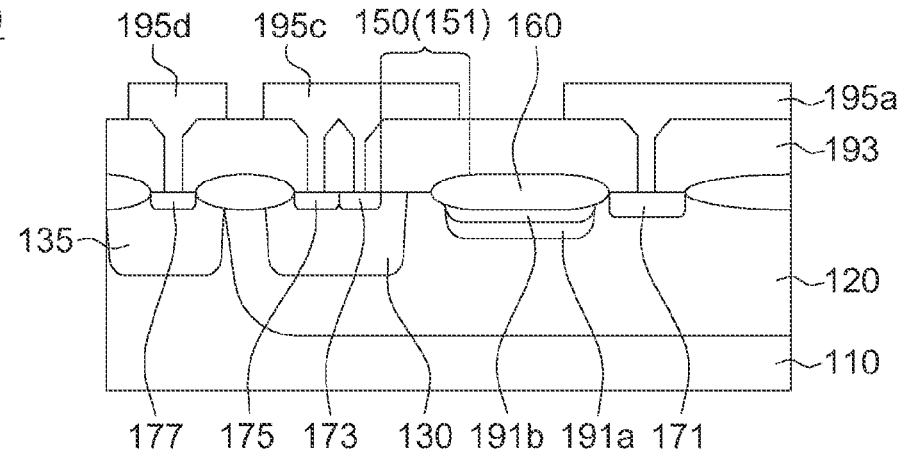
FIG. 1C shows a cross-sectional view along the section line 1C-1C' in FIG. 1A.

Referring to FIGS. 1A-1C, FIG. 1A shows a top view of a semiconductor according to an embodiment of the present disclosure, FIG. 1B shows a cross-sectional view along the section line 1B-1B' in FIG. 1A, and FIG. 1C shows a cross-sectional view along the section line 1C-1C' in FIG. 1A. The semiconductor structure 100 includes a first doped region 120, a second doped region 130, and a gate structure 140. The first doped region 120 has a first type conductivity. The second doped region 130 is formed in the first doped region 120 and has a second type conductivity opposite to the first type conductivity. The gate structure 140 is formed on the first doped region 120 and the second doped region 130. The gate structure 140 includes a first gate portion 141 and a second gate portion 143 separated from each other by a gap 150. The pattern of the gate structure 140 can decrease the electrical field under the gate structure 140, and the function of the gate structure 140 can maintain as well. Accordingly, the semiconductor structure 100 can endure a relatively high gate voltage stress.

In the embodiment, as shown in FIG. 1B, the gate structure 140 includes a spacer 140a formed on the sidewalls of the gate structure 140.

In the embodiment, as shown in FIG. 1A, the first gate portion 141 includes first gate blocks 141a and 141b, each having a C shaped structure. In the embodiment, the first gate portion 141 is electrically connected to a voltage source, for applying a voltage bias to the first gate portion 141.

In the embodiment, as shown in FIG. 1A, the second gate portion 143 includes at least two second gate blocks 143a and 143b, each having a C shaped structure and separated from each other. In the embodiment, the second gate portion 143 is electrically connected to a grounding end. In other words, the second gate portion 143 is for adjusting the electrical field distribution and not for applying a gate voltage to the semiconductor structure.

In the embodiment, the gap 150 includes at least two gap sections separated from each other, and the widths of the two gap sections are the same or different. As shown in FIG. 1A, the gap 150 of the semiconductor structure 100 includes four gate sections 151, 153, 155, and 157, each having a width D1, D2, D3, and D4, respectively. In the embodiment, the widths D1-D4 are all the same, but the widths D1-D4 are not limited to only one value.

In the embodiment, the semiconductor structure 100 can further includes an insulating structure 160 on the first doped region 120. As shown in FIG. 1B, the gate structure 150 (the first gate portion 141) extends on the insulating structure 160. As shown in FIG. 1C, on the cross-section along the section line 1C-1C', the gap 150 (the gap section 151) is on the first doped region 120 and the second doped region 130 and extends on the insulating structure 160.

As shown in FIGS. 1B-1C, the semiconductor structure 100 can further includes a substrate 110, and third doped region 135, a top doped region 191a, a doped layer 191b, a first doped electrode region 171, a second doped electrode region 173, a third doped electrode region 175, and a fourth doped electrode region 177. The first doped region and the third doped region 135 are formed in the substrate 110. The first doped electrode region 171 is formed in the first doped region 120. The second doped electrode region 173 and the third doped electrode region 175 are formed in the second doped region 130. The fourth doped electrode region 177 is formed in the third doped region 135. The top doped region 191a is formed in the first doped region 120, and the doped layer 191b is formed in the top doped region 191a.

As shown in FIGS. 1B-1C, the insulating structure 160 is on the top doped region 191b. The gate structure 140 is on the second doped region 130 between the first doped region 120 and the second doped electrode region 173.

In the embodiment, the semiconductor structure 100 can further includes a dielectric layer 193, a conductive layer 195a electrically connected to the first doped electrode region 171, a conductive layer 195c electrically connected to the gate structure 140, the second doped electrode region 173 and the third doped electrode region 175, a conductive layer 195d electrically connected to the fourth doped electrode region 177.

In the embodiment, the first doped region 120 and the doped layer 191b have a first type conductivity such as N type conductivity. The first doped region 120 is such as a high voltage N well (HVNW), and the doped layer 191b is such as a N-grade implant. The substrate 110, second doped region 130, the third doped region 135, the third doped electrode region 175, the fourth doped electrode region 177, and the doped region 191a have a second type conductivity such as P type conductivity, opposite to the first type conductivity. The substrate 110 is such as a P type substrate or a P-epi.

In one embodiment, the semiconductor structure 100 is a MOS device. In this case, the first doped electrode region 171 and the second doped electrode region 173 have the first type conductivity such as N type conductivity. The first doped electrode region 171 is used as the drain, and the second doped electrode region 173 is used as the source.

In another embodiment, the semiconductor structure 100 is an IGBT device. In this case, the first doped electrode region 171 has the second type conductivity such as P type conductivity. The second doped electrode region 173 has the first type conductivity such as N type conductivity. The first doped electrode region 171 is used as the anode, and the second doped electrode region 173 is used as the cathode.

Figure 2A:
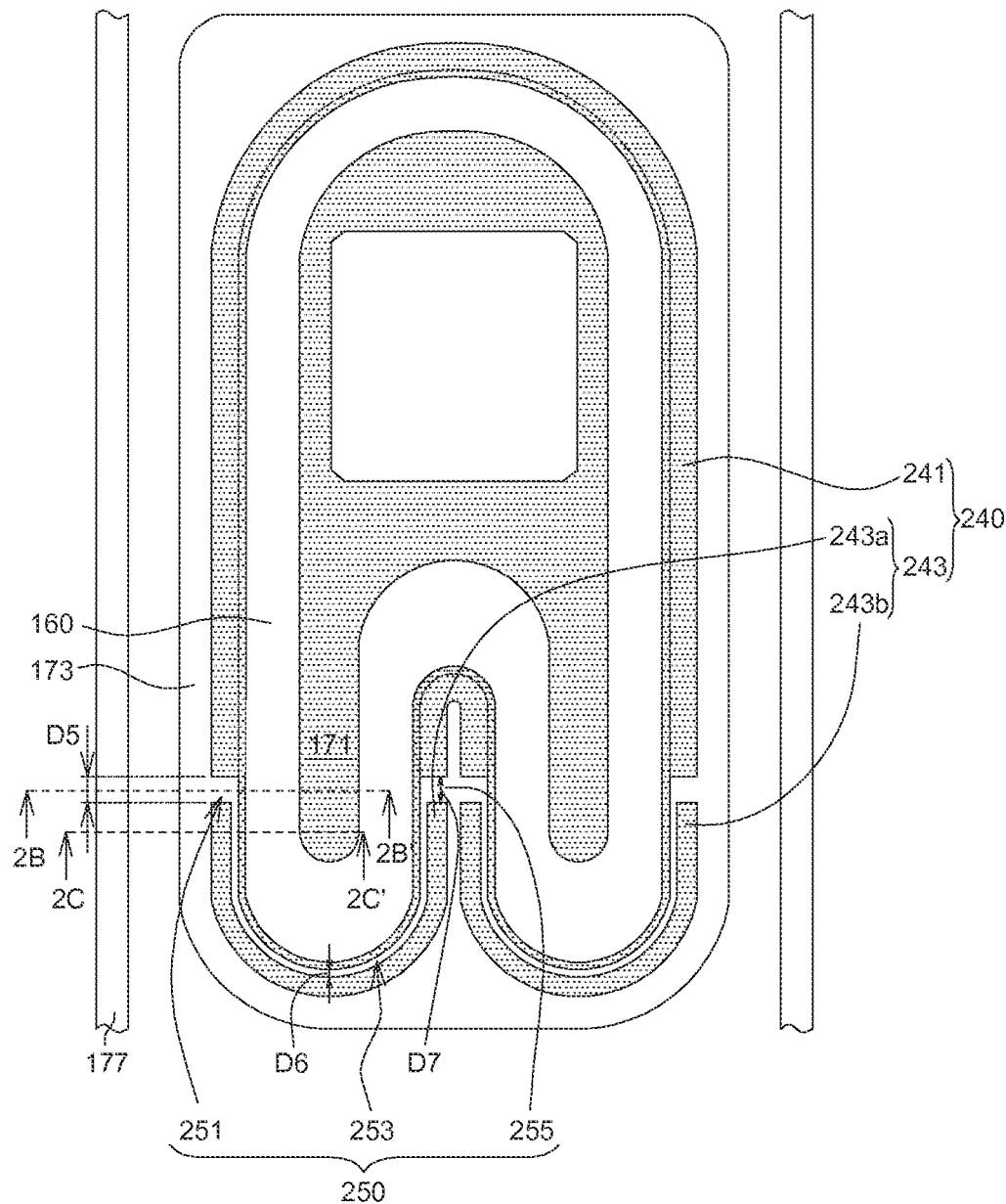
FIG. 2A shows a top view of a semiconductor according to another embodiment of the present disclosure.
Figure 2B:
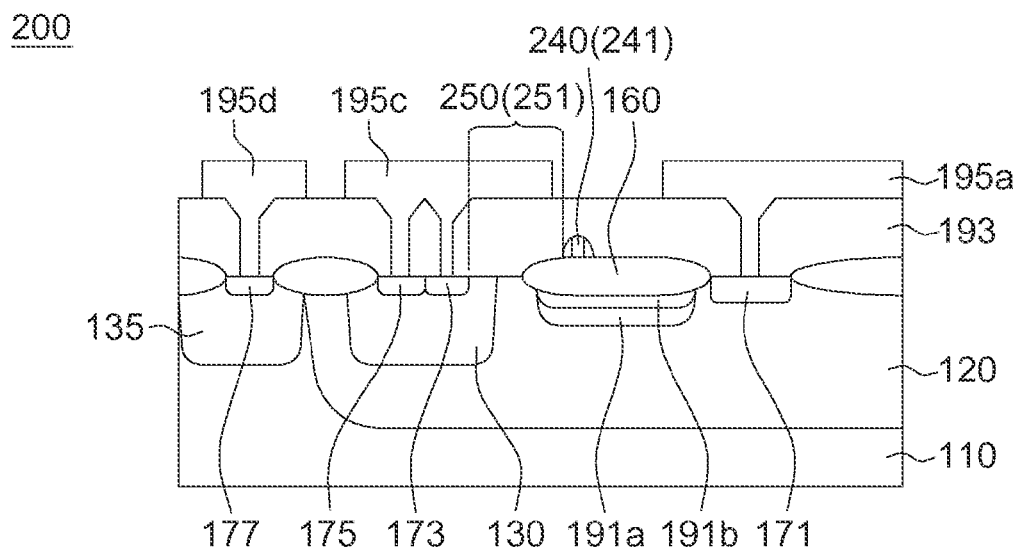
FIG. 2B shows a cross-sectional view along the section line 2B-2B' in FIG. 2A.
Figure 2C:
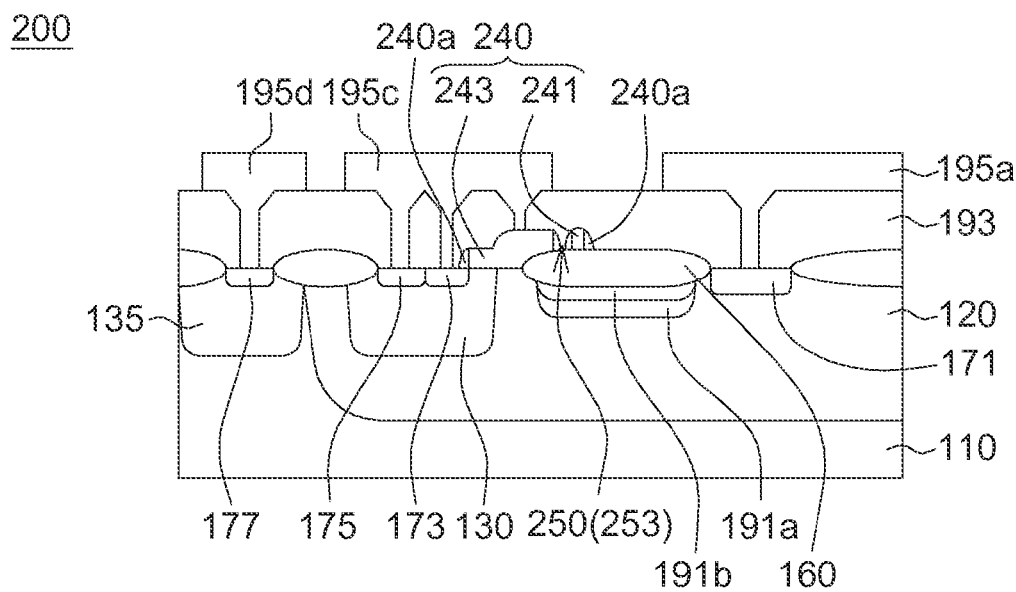
FIG. 2C shows a cross-sectional view along the section line 2C-2C' in FIG. 2A.

Referring to FIGS. 2A-2C, FIG. 2A shows a top view of a semiconductor according to another embodiment of the present disclosure, FIG. 2B shows a cross-sectional view along the section line 2B-2B' in FIG. 2A, and FIG. 2C shows a cross-sectional view along the section line 2C-2C' in FIG. 2A. The semiconductor device 200 of the present embodiment is different from the semiconductor device 100 of the embodiment as shown in FIGS. 1A-1C in the design of the gate structure 240 and the gap 250, and the similarities are not repeated here.

In the embodiment, as shown in FIG. 2A, the gate structure 240 includes a first gate portion 241 and a second gate potion 243 separated from each other by a gap 250. The first gate portion 241 has a ring structure. In the embodiment, the first gate portion 241 is electrically connected to a voltage source, for applying a voltage bias to the first gate portion 241. The second gate portion 243 includes at least two second gate blocks 243a and 243b, each having a C shaped structure and separated from each other. In the embodiment, the second gate portion 243 is electrically connected to a grounding end for adjusting the electrical field distribution.

In the embodiment, the gap 250 includes at least two gap sections connected to each other, the two connected gap sections form a specific angle, and the widths of the two gap sections are the same or different. As shown in FIG. 2A, the gate structure 240 of the semiconductor structure 200 is separated by two gaps 250, and each gap 250 includes three gap sections 251, 253, and 255, each having a width D5, D6, and D7, respectively. In the embodiment, the widths D5 and D7 are the same, but the width (D5 and D7) can be the same with or different from the width D6. Besides, the gap section 251 and the gap section 253 form a specific angle θ, which is smaller than 180°.

In the embodiment, as shown in FIG. 2B, on the cross-section along the section line 2B-2B', the first gate portion 241 of the gate structure 240 is on the insulating structure 160, and the gap 250 (the gap section 251) is on the first doped region 120 and the second doped region 130.

In the embodiment, as shown in FIG. 2C, on the cross-section along the section line 2C-2C', the first gate portion 241 of the gate structure 240 is on the insulating structure 160. The second gate portion 243 of the gate structure 240 is on the first doped region 120 and the second doped region 130 and extends on the insulating structure 160. The gap 250 (the gap section 253) is on the insulating structure 160. As shown in FIG. 2C, the spacer 240a is formed on the outer sidewalls of the gate structure 240 and in the gap 250 (253).

Referring to FIGS. 3-5C, FIGS. 3-5C illustrate a process for manufacturing a semiconductor structure according to an embodiment of the present disclosure.

Figure 3:
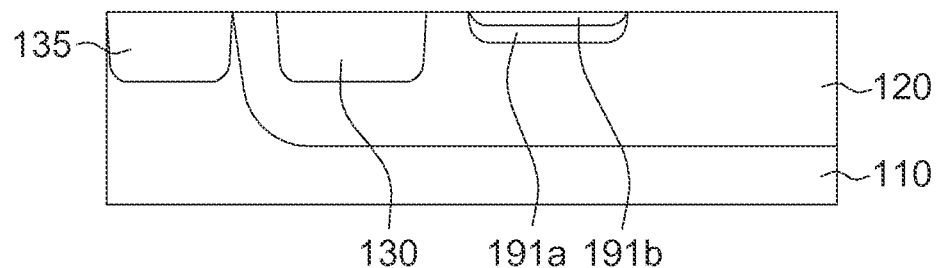
FIGS. 3-5C illustrate a process for manufacturing a semiconductor structure according to an embodiment of the present disclosure.

As shown in FIG. 3, the substrate 110, such as a bulk silicon or a SOI, is provided. The first doped region 120 is formed in the substrate 110. The second doped region 130 is formed in the first doped region 120. The third doped region 135 is formed in the substrate 110. In one embodiment, the first doped region 120 has the first type conductivity such as N type conductivity, and the second doped region 130 and the third doped region 135, both having the second type conductivity such as P type conductivity, are simultaneously formed by using the same mask. Next, the top doped region 191a is formed in the first doped region 120, and the doped layer 191b is formed in the top doped region 191a. In the embodiment, the top doped region 191a and the doped layer 191b are respectively formed by using different masks.

Figure 4:
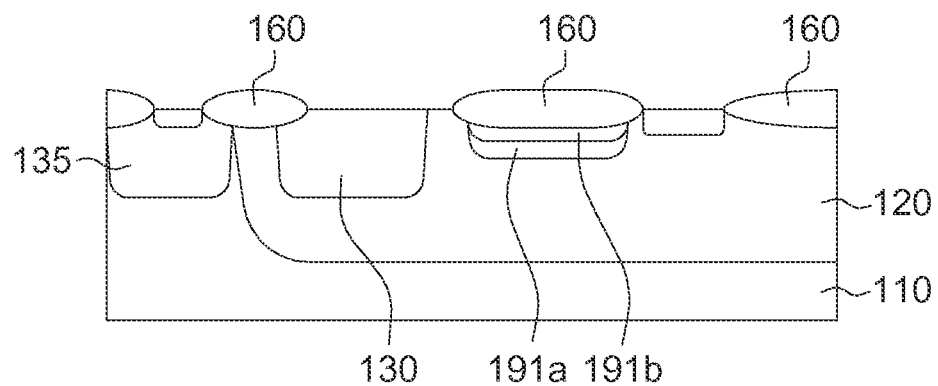

As shown in FIG. 4, the insulating structure 160 is formed on the doped layer 191b. The insulating structure 160 can further be formed on the first doped region 120, and between the second doped region 130 and the third doped region 135. The insulating structure 160 is not limited to a FOX as shown in FIG. 4. The insulating structure 160 may comprise a STI or other suitable dielectric structures.

Figure 5A:
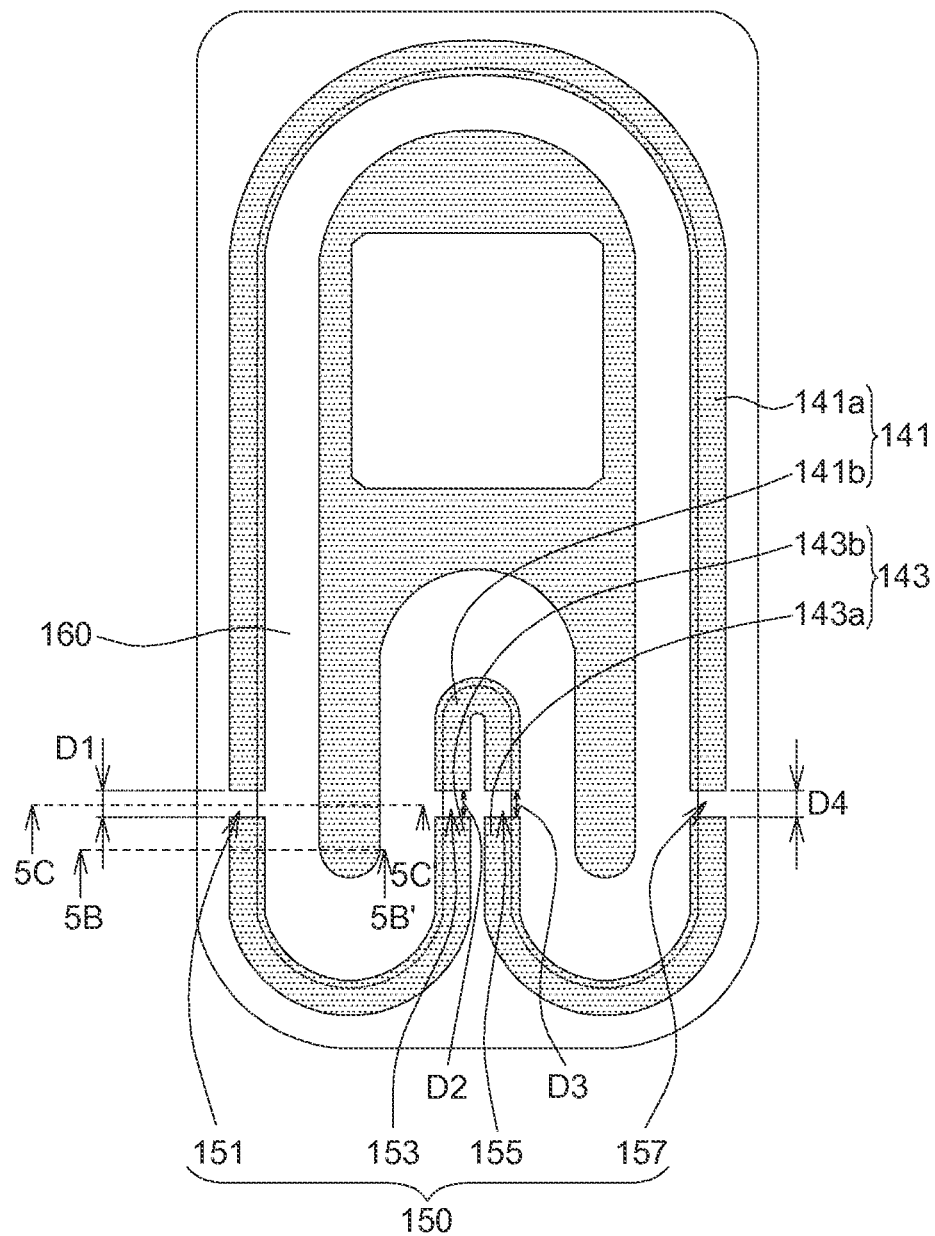
Figure 5B:
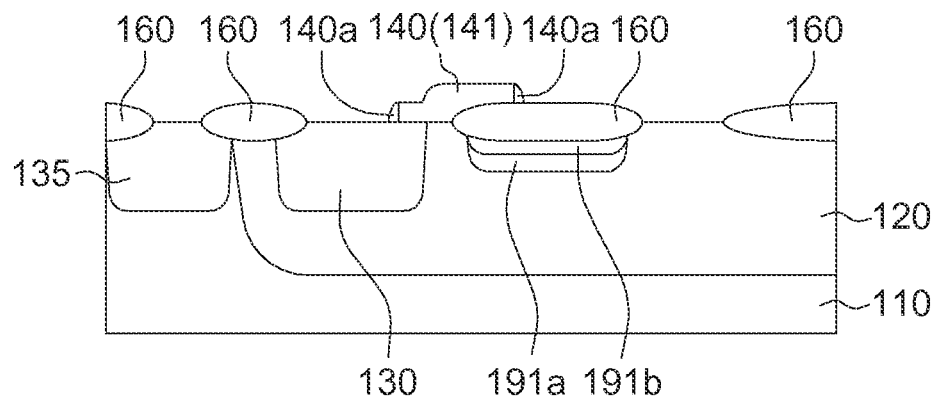
Figure 5C:
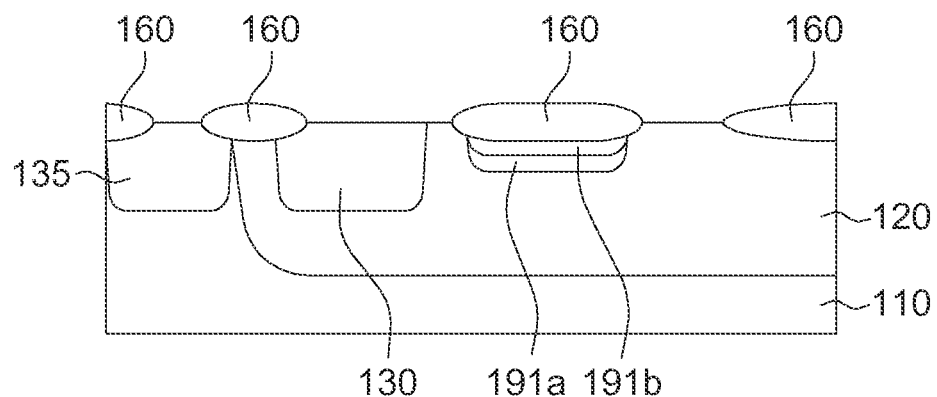

Referring to FIGS. 5A-5C, FIG. 5B shows a cross-sectional view along the section line 5B-5B' in FIG. 5A, and FIG. 5C shows a cross-sectional view along the section line 5C-5C' in FIG. 5A. The gate structure 140 is formed on the first doped region 120 and the second doped region 130 and extends on the insulating structure 160. The spacer 140a is further formed on the sidewalls of the gate structure 140. In the embodiment, the gate structure 140 may comprise a polysilicon layer and a metal silicide layer, such as tungsten silicide, formed on the polysilicon layer. The spacer 140a may comprise silicon dioxide such as tetraethoxy silane (TEOS).

In the embodiment, the manufacturing method of the gate structure 140 includes such as the following steps. A polysilicon layer and a metal silicide layer are formed. And then, the polysilicon layer and the metal silicide layer are patterned by a mask etching process to form the first gate portion 141 and the second gate portion 143 separated by the gap 150. Next, the spacer 140a is formed on the sidewalls. As such, the gate structure as shown in FIGS. 5A-5C is formed. The first gate block of the first gate portion 141 having a C shaped structure extends on the insulating structure 160. The second gate portion 143 includes at least two second gate blocks 143a and 143b separated from each other, each having a C shaped structure. The gap section 151 is on the first doped region 120 and the second doped region 130 and extends on the insulating structure 160. In the embodiment, the above-mentioned gate structure 140 is formed in one mask etching process.

Next, referring to FIGS. 1A-1C, the first doped electrode region 171 is formed in the first doped region 120. The second doped electrode region 173 and the third doped electrode region 175 are formed in the second doped region 130. The fourth doped electrode region 177 is formed in the third doped region 135. In the embodiment, the first doped electrode region 171, the second doped electrode region 173, the third doped electrode region 175, and the fourth doped electrode region 177 are formed by a heavy doping.

Next, referring to FIGS. 1A-1C, the dielectric layer 193 is formed on the substrate 110. The conductive layers 195a, 195c, and 195d are formed by filling a conductive material into the openings of the dielectric layer 193 and then patterning the conductive material. The conductive layers 195a, 195c, and 195d comprise a metal such as W, Cu, Al, and so on.

Figure 6A:
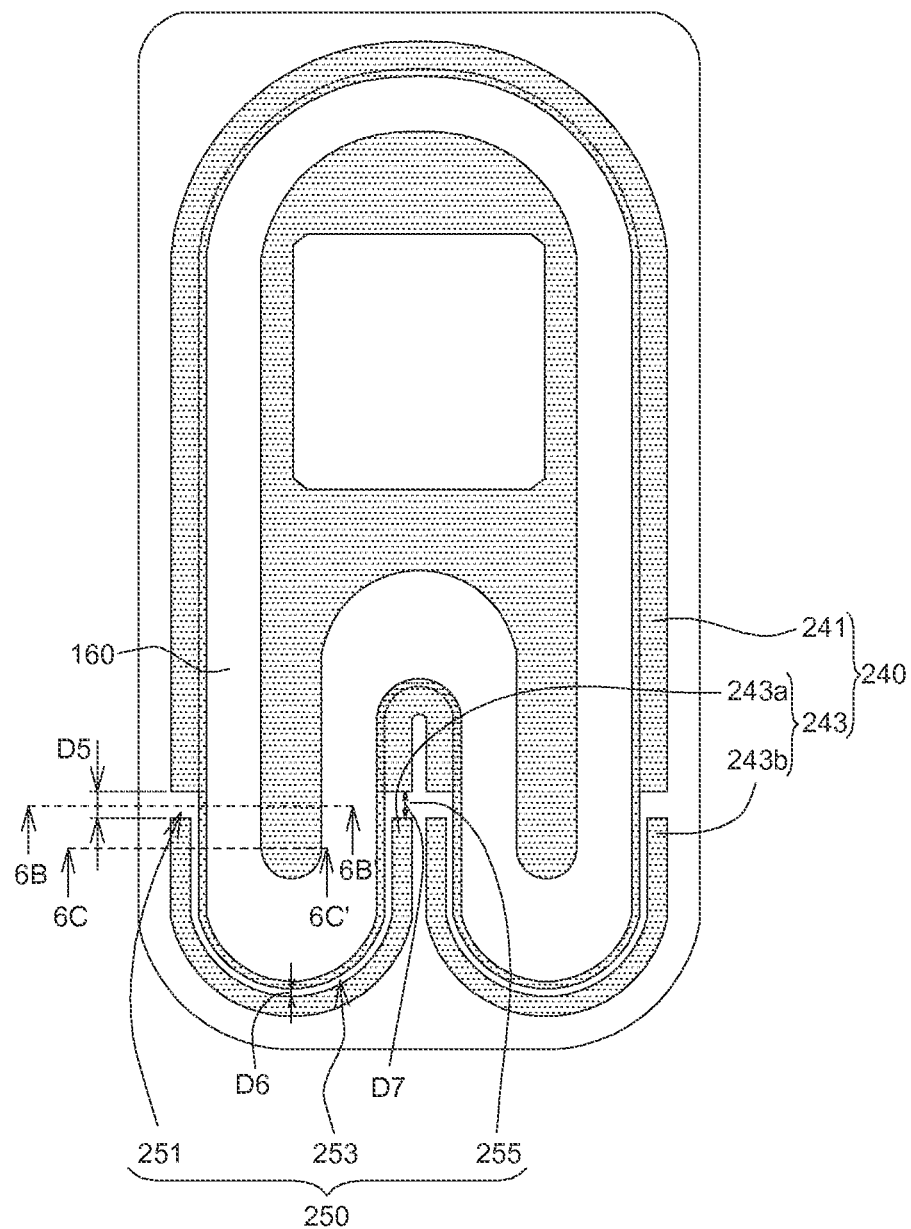
FIGS. 6A-6C illustrate a process for manufacturing a semiconductor structure according to another embodiment of the present disclosure.
Figure 6B:
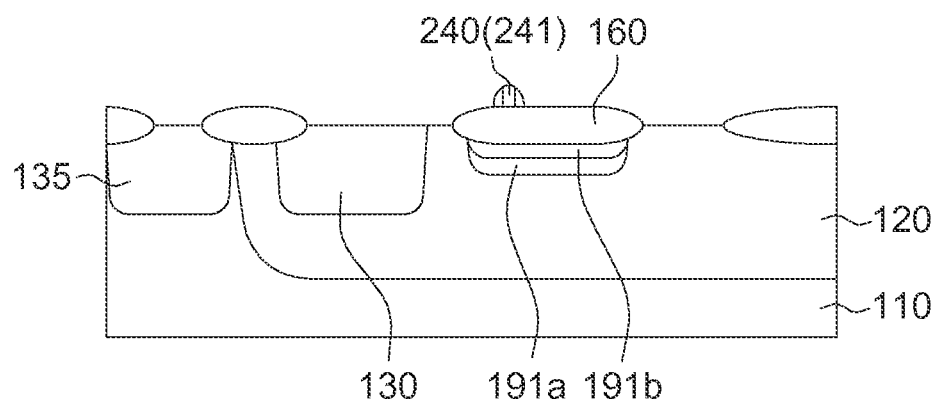
Figure 6C:
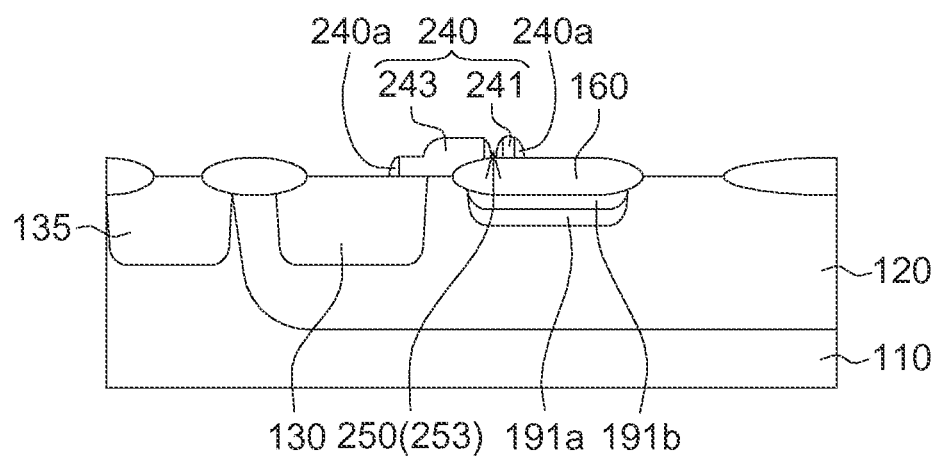

FIGS. 6A-6C illustrate a process for manufacturing a semiconductor structure according to another embodiment of the present disclosure. The manufacturing process of the semiconductor device 200 of the present embodiment is different from the manufacturing process of the semiconductor device 100 of the embodiment as shown in FIGS. 3-5C in the design of the gate structure 240 and the gap 250, and the similarities are not repeated here.

Referring to FIGS. 3-4 and 6A-6C, the first doped region 120 and the third doped region 135 are formed in the substrate 110. The second doped region 130 is formed in the first doped region 120. The top doped region 191a is formed in the first doped region 120, and the doped layer 191b is formed in the top doped region 191a. The insulating structure 160 is formed on the doped layer 191b.

Referring to FIGS. 6A-6C, FIG. 6B shows a cross-sectional view along the section line 6B-6B' in FIG. 6A, and FIG. 6C shows a cross-sectional view along the section line 6C-6C' in FIG. 6A. The gate structure 240 is formed on the first doped region 120 and the second doped region 130 and extends on the insulating structure 160. The spacer 240a is further formed on the sidewalls of the gate structure 240. The description of the material of the gate structure 240 is as described for the gate structure 140, and the similarities are not repeated here.

In the embodiment, the manufacturing method of the semiconductor structure 200 includes such as the following steps. A polysilicon layer and a metal silicide layer are formed, and then the polysilicon layer and the meta silicide layer are patterned by a mask etching process to form the first gate portion 241 and the second gate portion 243 separated by the gap 250. Next, the spacer 240a is formed on the outer sidewalls and in the gap 250 (253). As such, the gate structure 240 as shown in FIGS. 6A-6C is formed. The first gate portion has a ring structure and extends to the insulating structure 160. The second gate potion 243 includes at least two second gate blocks 243a and 243b separated from each other, each having a C shaped structure. The gap sections 251 and 253 are on the first doped region 120 and the second doped region 130. In the embodiment, the above-mentioned gate structure 240 is formed in one mask etching process.

Next, referring to FIGS. 2A-2C, the first doped electrode region 171 is formed in the first doped region 120. The second doped electrode region 173 and the third doped electrode region 175 are formed in the second doped region 130. The fourth doped electrode region 177 is formed in the third doped region 135. The dielectric layer 193 is formed on the substrate 110. The conductive layers 195a-195d are formed in the openings of the dielectric layer 193.

Figure 7:
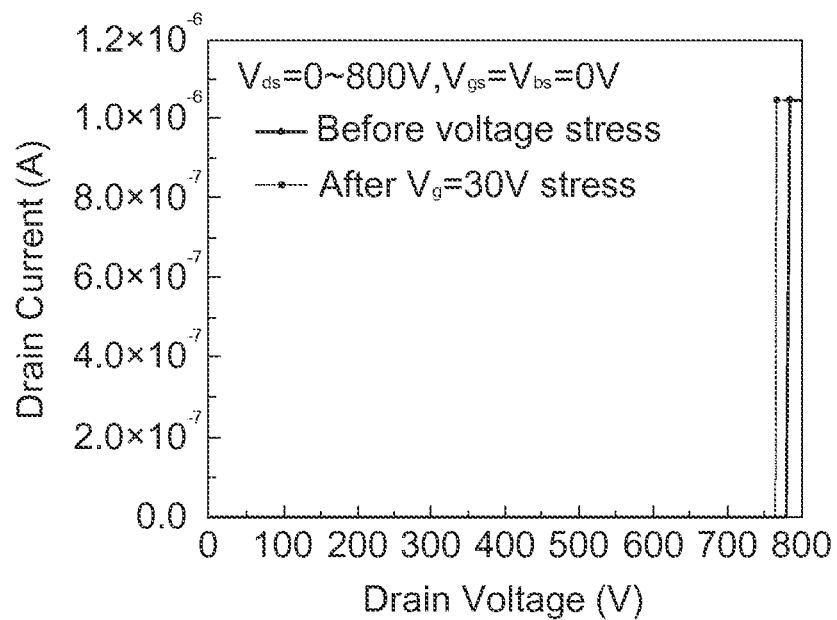
FIG. 7 illustrates I-V curves of a semiconductor structure according to an embodiment of the present disclosure.
Figure 8:
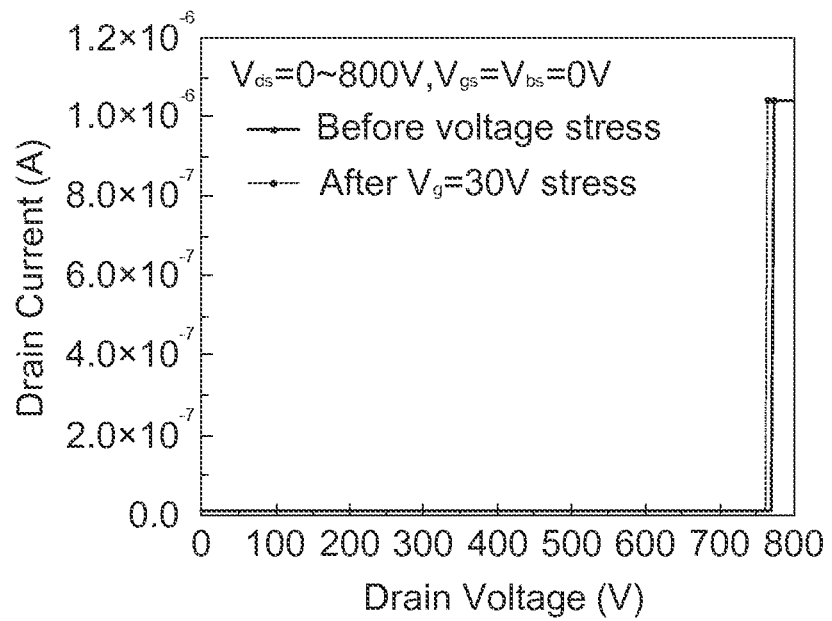
FIG. 8 illustrates I-V curves of a semiconductor structure according to another embodiment of the present disclosure.

FIG. 7 illustrates I-V curves of a semiconductor structure according to an embodiment of the present disclosure, and FIG. 8 illustrates I-V curves of a semiconductor structure according to another embodiment of the present disclosure. In the embodiment, the semiconductor structure can be applied for a HV, ultra-HV (such as 300V~1000V) device, such as MOS, IGBT, and diode. As shown in FIGS. 7-8, after the high temperature gate bias (HTGB) test, the breakdown voltage of the semiconductor structure 100 only slightly decreases from 785V to 770V, and the breakdown voltage of the semiconductor 200 only slightly decreases from 775V to 765V. In summary, the breakdown voltage of the semiconductor structure in embodiments can be kept over 700 V (765V).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a first doped region having a first type conductivity;
    a second doped region formed in the first doped region and having a second type conductivity opposite to the first type conductivity;
    a gate structure formed on the first doped region and the second doped region, comprising a first gate portion and a second gate portion separated from each other by a gap; and
    a dielectric layer formed on the gate structure, wherein the dielectric layer is in direct contact with both of the first doped region and the second doped region through the gap.

2. The semiconductor structure according to claim 1, wherein the first gate portion comprises at least one of a C shaped structure and a ring structure.

3. The semiconductor structure according to claim 1, wherein the first gate portion is electrically connected to a voltage source, for applying a voltage bias to the first gate portion.

4. The semiconductor structure according to claim 1, wherein the second gate portion comprises at least two second gate blocks separated from each other, and each of the two second gate blocks has a C shaped structure.

5. The semiconductor structure according to claim 1, wherein the second gate portion is electrically connected to a grounding end.

6. The semiconductor structure according to claim 1, wherein the gap comprises at least two gap sections separated from each other, and the widths of the two gap sections are the same or different.

7. The semiconductor structure according to claim 1, wherein the gap comprises at least two gap sections, the two gap sections are connected to each other forming a specific angle, and the widths of the two gap sections are the same or different.

8. The semiconductor structure according to claim 1, further comprising:
an insulating structure on the first doped region, wherein the gate structure extends on the insulating structure.

9. The semiconductor structure according to claim 1, further comprising:
a first doped electrode region formed in the first doped region; and
a second doped electrode region formed in the second doped region, wherein each of the first doped electrode region and the second doped electrode region has one of the first type conductivity and the second type conductivity.

10. A method for manufacturing a semiconductor structure, comprising:
forming a first doped region having a first type conductivity;
forming a second doped region in the first doped region, wherein the second doped region has a second type conductivity opposite to the first type conductivity;
forming a gate structure on the first doped region and the second doped region, comprising forming a first gate portion and a second gate portion separated from each other by a gap; and
forming a dielectric layer on the gate structure, wherein the dielectric layer is in direct contact with both of the first doped region and the second doped region through the gap.

11. The method for manufacturing the semiconductor according to claim 10, wherein the first gate portion comprises at least one of a C shaped structure and a ring structure.

12. The method for manufacturing the semiconductor according to claim 10, wherein the first gate portion is electrically connected to a voltage source, for applying a voltage bias to the first gate portion.

13. The method for manufacturing the semiconductor according to claim 10, wherein the step of forming the second gate portion comprises:
forming at least two second gate blocks separated from each other, and each of the two second gate blocks has a C shaped structure.

14. The method for manufacturing the semiconductor according to claim 10, wherein the second gate portion is electrically connected to a grounding end.

15. The method for manufacturing the semiconductor according to claim 10, wherein the gap comprises at least two gap sections separated from each other, and the widths of the two gap sections are the same or different.

16. The method for manufacturing the semiconductor according to claim 10, wherein the gap comprises at least two gap sections, the two gap sections are connected to each other forming a specific angle, and the widths of the two gap sections are the same or different.

17. The method for manufacturing the semiconductor according to claim 10, further comprising:
forming an insulating structure on the first doped region, wherein the gate structure extends on the insulating structure.

18. The method for manufacturing the semiconductor according to claim 10, further comprising:
forming a first doped electrode region in the first doped region; and
forming a second doped electrode region in the second doped region, wherein each of the first doped electrode region and the second doped electrode region has one of the first type conductivity and the second type conductivity.

19. A semiconductor structure, comprising:
a substrate;
a first doped region having a first type conductivity formed in the substrate;
a second doped region formed in the first doped region and having a second type conductivity opposite to the first type conductivity;
a third doped region having the second type conductivity formed in the substrate, wherein the third doped region is adjacent to the first doped region;
a doped electrode region having the first type conductivity formed in the second doped region;
a gate structure formed on the first doped region and the second doped region;
a dielectric layer formed on the gate structure, wherein the dielectric layer is in direct contact with all of the first doped region, the second doped region, and the doped electrode region; and
a conductive layer formed on the dielectric layer and electrically connected to the third doped region.

* * * * *